Nov. 26, 1963 A. W. HOLT 3,112,453

DIODE AMPLIFIER

Original Filed Sept. 9, 1954 6 Sheets-Sheet 1

TRANSISTOR ANALOGUE CIRCUIT

Fig. 4-A

INVENTOR

Arthur W. Holt

BY Arthur Vinograd

ATTORNEY

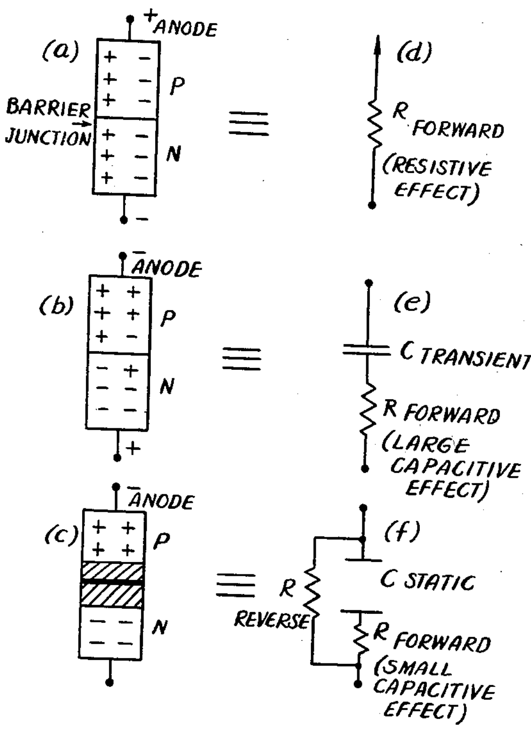
CAPACITOR ANALOGUE FOR DIODE AMPLIFIER
Fig. 5
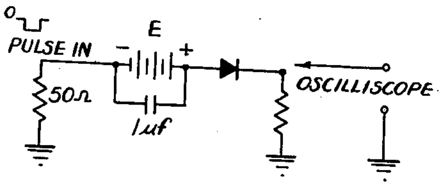
TRANSIENT TEST CIRCUIT
Fig. 6
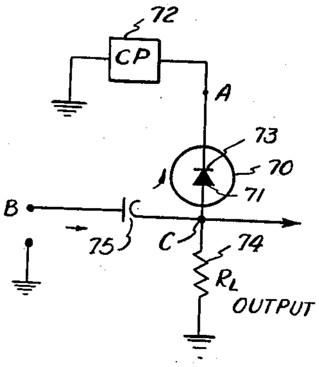
Fig. 7-A
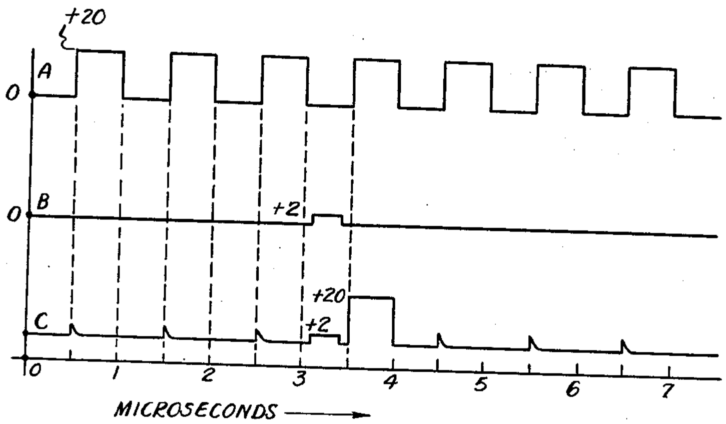
Fig. 7-B, Fig. 7-C, Fig. 7-D
RESISTANCE-DIODE-COUPLED AMPLIFIER
INVENTOR
Arthur W. Holt
BY Arthur Vinograd
ATTORNEY Nov. 26, 1963 A. W. HOLT 3,112,453
DIODE AMPLIFIER
Original Filed Sept. 9, 1954 6 Sheets-Sheet 3
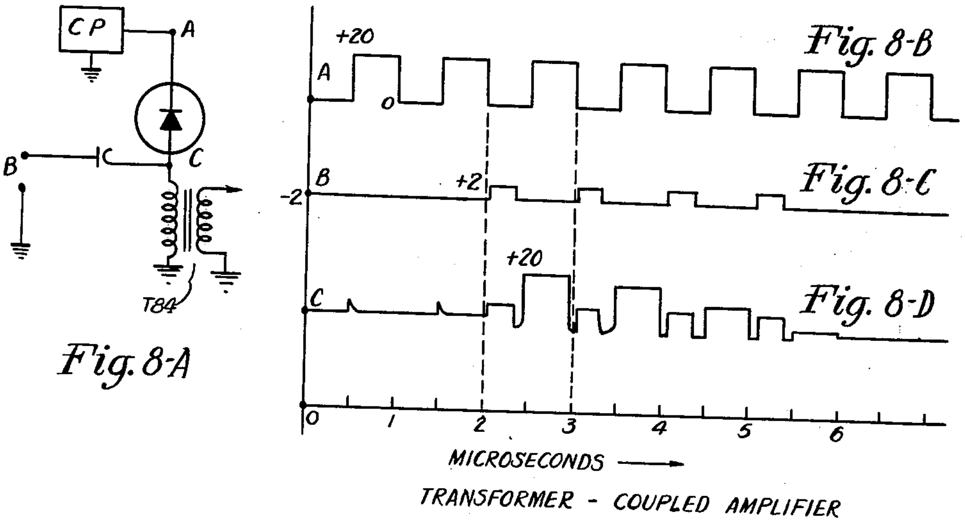
Fig. 8-A, Fig. 8-B, Fig. 8-C, Fig. 8-D
TRANSFORMER - COUPLED AMPLIFIER
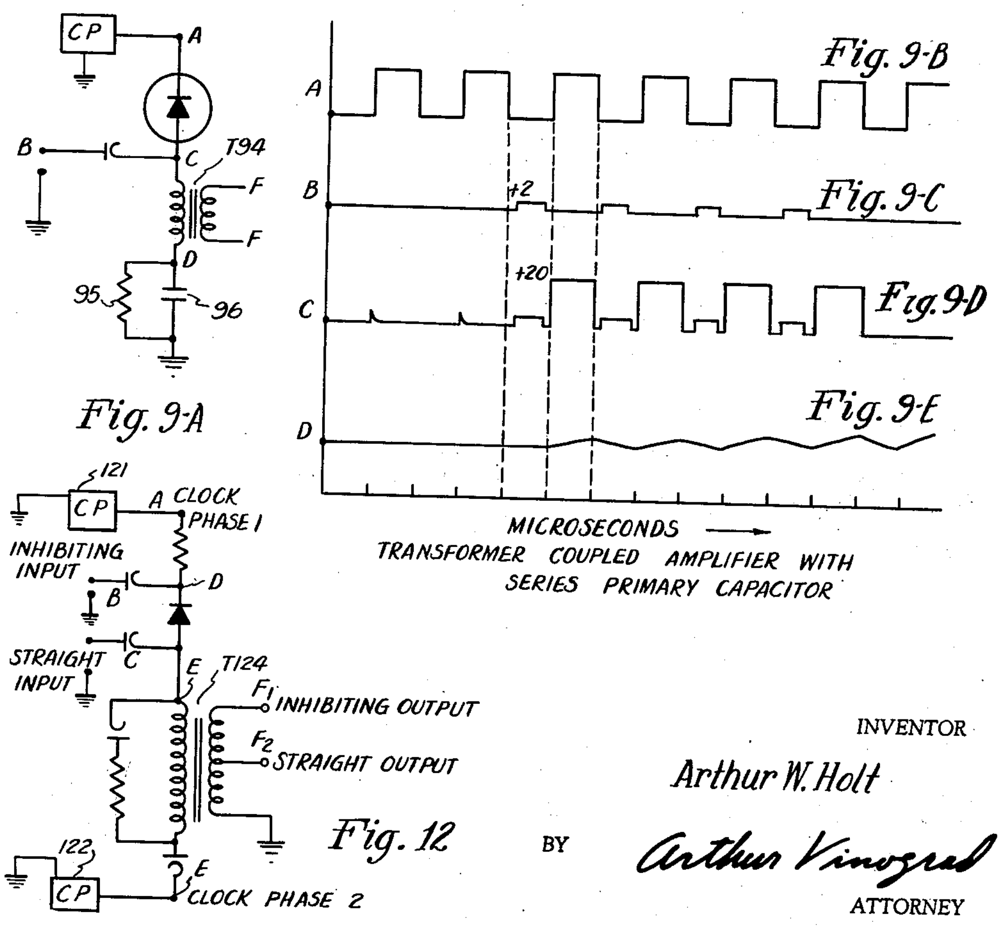
Fig. 9-A, Fig. 9-B, Fig. 9-C, Fig. 9-D, Fig. 9-E, Fig. 12
TRANSFORMER COUPLED AMPLIFIER WITH SERIES PRIMARY CAPACITOR
INVENTOR
Arthur W. Holt
BY Arthur Vinograd
ATTORNEY Nov. 26, 1963 | A. W. HOLT | 3,112,453
DIODE AMPLIFIER
Original Filed Sept. 9, 1954 | 6 Sheets-Sheet 4
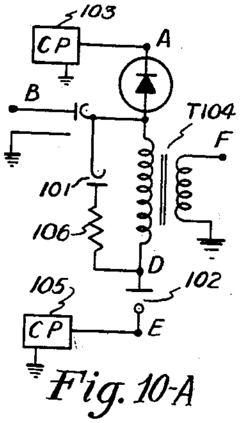
Fig. 10-A
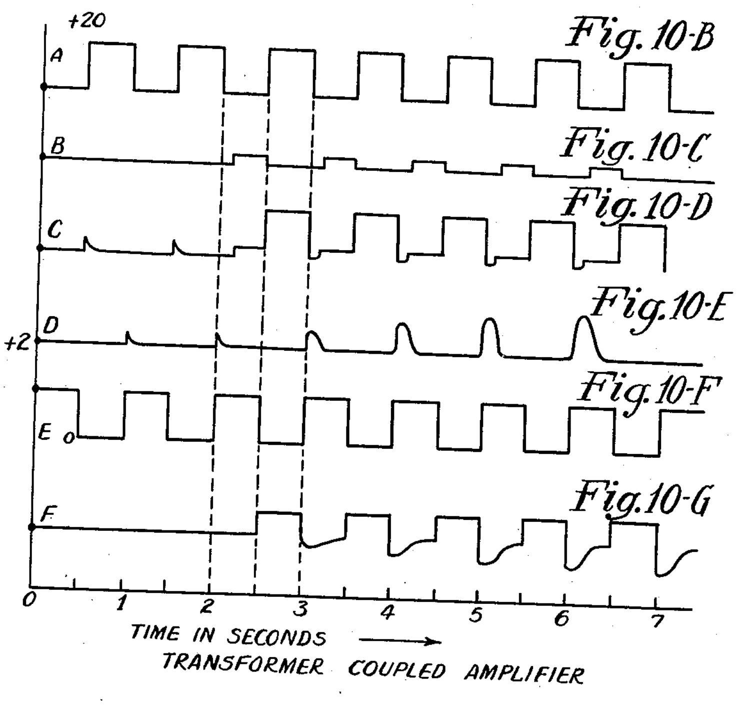
Fig. 10-B, Fig. 10-C, Fig. 10-D, Fig. 10-E, Fig. 10-F, Fig. 10-G
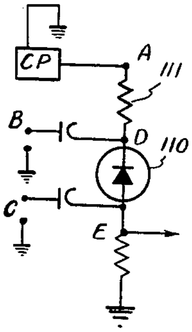
Fig. 11-A
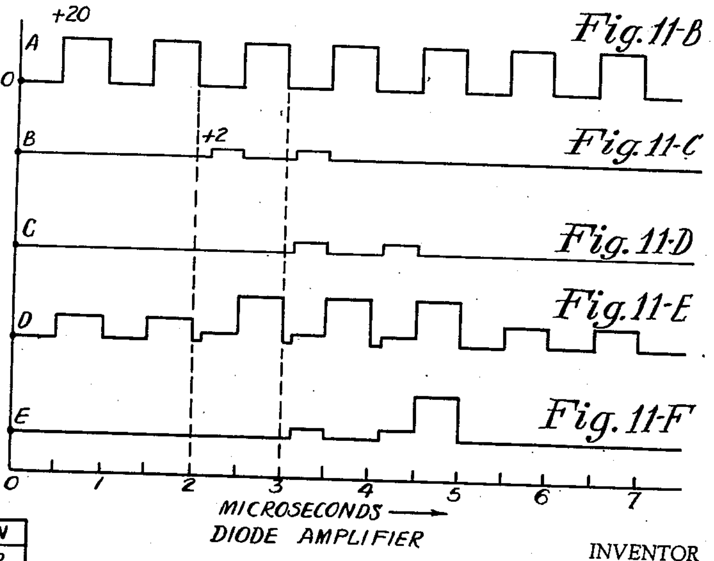
Fig. 11-B, Fig. 11-C, Fig. 11-D, Fig. 11-E, Fig. 11-F
| C \ B | UP | DOWN |
|---|---|---|
| UP | DOWN | UP |
| DOWN | DOWN | DOWN |
Fig. 11-G
INVENTOR
Arthur W. Holt
BY Arthur Vinograd
ATTORNEY Nov. 26, 1963 A. W. HOLT 3,112,453
DIODE AMPLIFIER
Original Filed Sept. 9, 1954
6 Sheets-Sheet 5
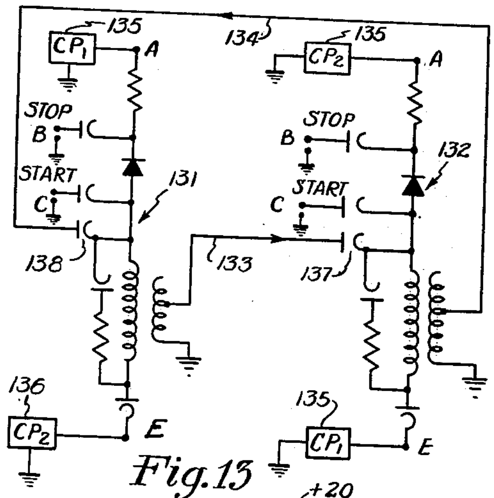
Fig. 13
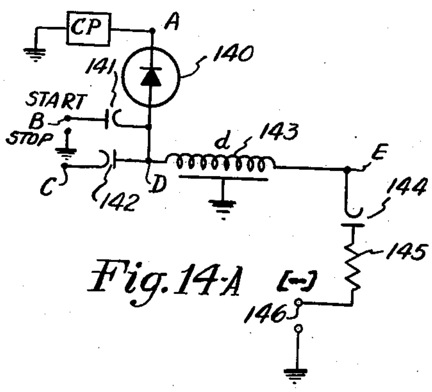
Fig. 14-A
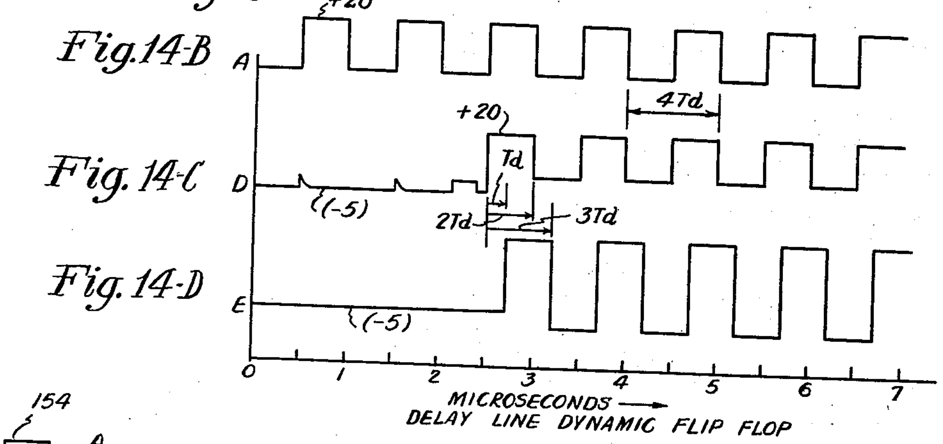
Fig. 14-B Fig. 14-C Fig. 14-D
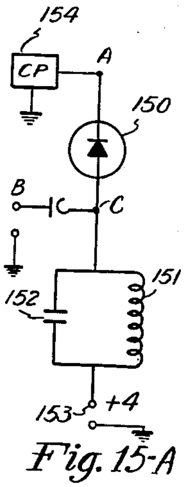
Fig. 15-A
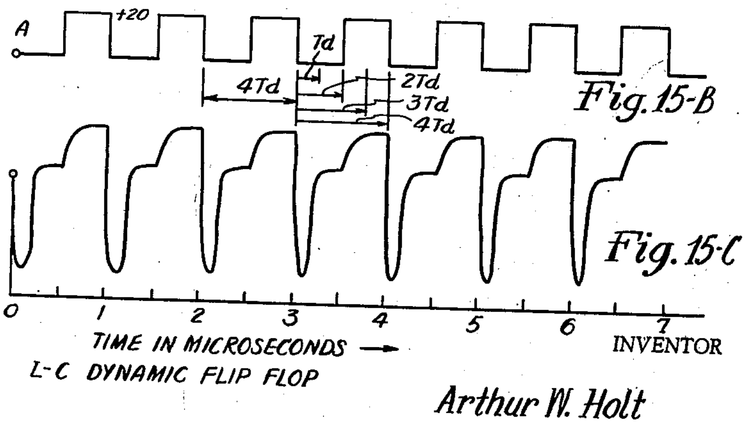
Fig. 15-B Fig. 15-C
INVENTOR
Arthur W. Holt
BY
Arthur Vinograd
ATTORNEY

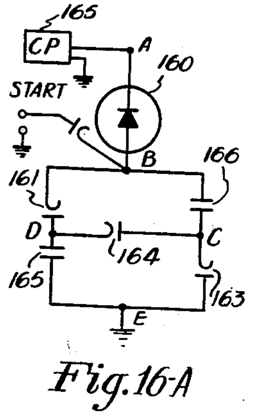
Fig. 16-A
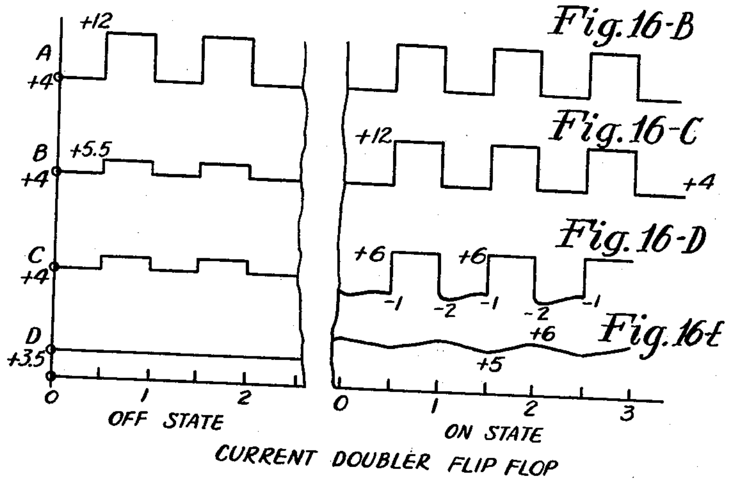
Fig. 16-B, Fig. 16-C, Fig. 16-D, Fig. 16-E
CURRENT DOUBLER FLIP FLOP
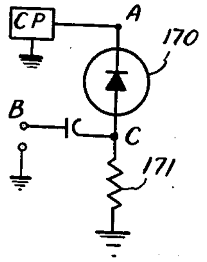
Fig. 17-A
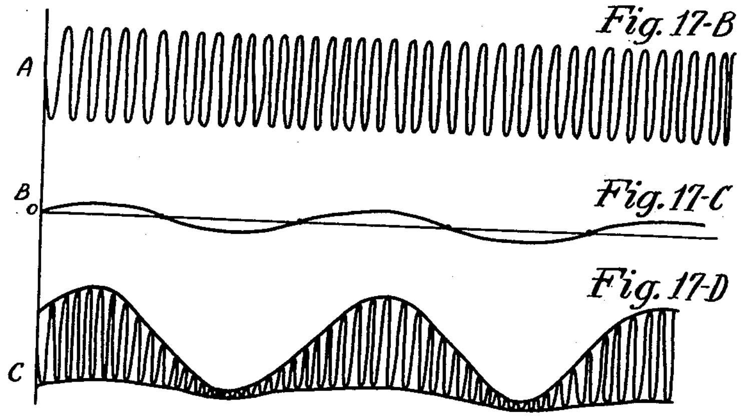
Fig. 17-B, Fig. 17-C, Fig. 17-D
AUDIO AMPLIFIER USING "CARRIER"
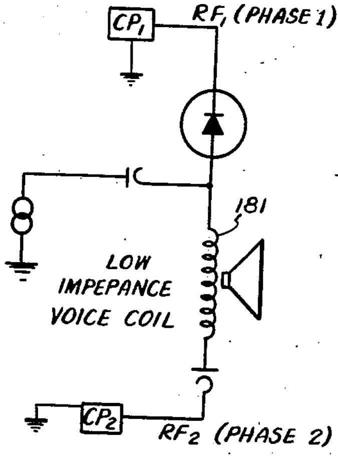
Fig. 18
INVENTOR
Arthur W. Holt
BY Arthur Vinograd
ATTORNEY United States Patent Office 3,112,453

Patented Nov. 26, 1963

3,112,453
DIODE AMPLIFIER

Arthur W. Holt, Silver Spring, Md., assignor to the United States of America as represented by the Secretary of Commerce Original application Sept. 9, 1954, Ser. No. 455,097, now Patent No. 2,879,409, dated Mar. 24, 1959. Divided and this application July 29, 1958, Ser. No. 751,813
5 Claims. (Cl. 330—34)

This invention relates to the art of semiconductors preferably of the type comprised of monocrystalline germanium or silicon and is particularly concerned with a novel method and apparatus whereby a diode made of semiconductive material will function as an amplifier.

The present invention is a division of application Serial No. 455,097, Diode Amplifier, filed September 9, 1954, in the name of Arthur W. Holt, now patent No. 2,879,409 issued on March 24, 1959.

Commercially available semiconductive diodes identifiable as type 1N34 etc. are known to exhibit transient responses which are normally considered detrimental in that their behavior particularly at higher freqency levels inhibits rectification. Specifically, the reverse transient response, which occurs during the time in which the holes or carriers remain available after the carrier initiating energy has been cut off, may be regarded as a characteristic whereby the diode exhibits a certain amount of inertia which vitiates the inverse or back resistance which an ideal rectifier should possess. Advantage is taken of such reverse transient phenomenon according to the present invention to produce amplification in a two-element rectifying semiconductive device.

An immediate object of this invention is to provide a novel method and means for operating a diode of the character described which will exhibit characteristics of amplification.

Consequent to the obtainment of amplification properties by using a diode as the basic circuit component, numerous other applications of the singular principles involved are established and additional objects of this invention contemplete the provision of novel circuitry for establishing a two-input diode gate, a pulse repeater amplifier, a delay line dynamic flip-flop circuit, an L-C dynamic flip-flop circuit, a current doubler flip-flop and a carrier type audio amplifier.

The above objects have been cited as exemplary, but the disclosed principles when fully appreciated will suggest numerous other applications and embodiments within the generic teachings of the invention.

Figure 1:
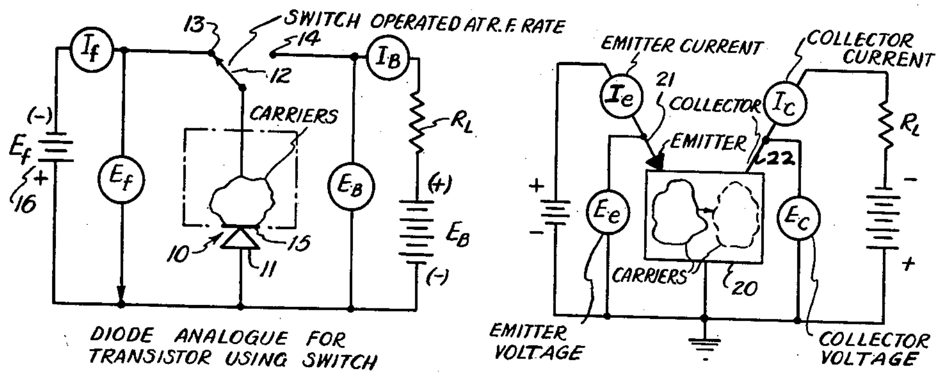
FIG. 1 is a basic circuit diagram used to illustrate the principles involved.

FIG. 4*a* is a typical diode characteristic curve showing pertinent defining points;

FIGS. 5*a* to 5*f* symbolize a capacitor analogue which is convenient to explain the principles whereby amplification is achieved according to the present invention;

FIG. 6 shows a test circuit employed to measure and demonstrate the amplification obtained by employing a diode as the amplifier according to the present invention;

FIG. 7*a* shows a preferred embodiment of a resistance-diode-coupled diode amplifier circuit comprising the present invention;

FIGS. 7*b*–7*d* are diagrams showing the waveforms applicable to FIG. 7*a*;

FIG. 8*a* shows another embodiment of the present invention employed as a transformer coupled amplifier;

FIGS. 8*b*–8*d* are diagrams showing the waveforms applicable to the circuit of FIG. 8*a*;

FIG. 9*a* shows a modification of the transformer coupled amplifier shown in FIG. 8;

FIGS. 9*b*–9*e* are diagrams showing the waveforms applicable to the circuit of FIG. 9*a*;

FIG. 10*a* shows a further embodiment of the present invention employed as a transformer coupled amplifier similar to FIG. 9*a* but with transformer recovery provided for;

FIGS. 10*b*–10*g* illustrate the waveforms involved in connection with the embodiment of FIG. 10*a*;

FIG. 11*a* shows another embodiment of the present invention employed as a two-input diode amplifier gate;

FIGS. 11*b*–11*g* illustrate the waveforms involved in the circuit of FIG. 11*a*;

FIG. 12 shows a still further embodiment of the present invention employed as a pulse amplifier repeater stage;

FIG. 13 shows the present invention employed as a dynamic flip-flop circuit;

FIG. 14*a* shows a modified dynamic flip-flop circuit incorporating a delay line;

FIGS. 14*b*–14*d* show the waveforms involved in the operation of the circuit of FIG. 14*a*;

FIG. 15*a* shows the present invention employed as an L-C dynamic flip flop;

FIG. 15*b*–15*c* show the waveforms involved in the modification of FIG. 15*a*;

FIG. 16*a* shows an embodiment of the present invention as a current doubler flip flop;

FIGS. 16*b*–16*e* show the waveforms involved in the embodiment of FIG. 16*a*;

FIGS. 17*a* to 17*d* show the present invention employed as a carrier type of audio amplifier together with the waveforms involved, and FIG. 18 shows a modification in which the diode amplifier directly drives a voice coil.

In order to explain the present invention it will be helpful to briefly review a few basic considerations involving the construction, physical characteristics and behavior under dynamic conditions of known types of semiconductors. This invention is principally concerned with the use of semiconductor diodes made of germanium or silicon of both point contact and junction types.

The transient response characteristics of a semiconductor diode can be divided into a forward transient and a reverse transient. The present invention is not concerned with the forward transient response. The reverse transient response may be broadly defined as the inability of a diode to immediately revert to a condition of static back resistance after a forward current has been applied thereo. Such transient response characteristic is generally considered detrimental in circuit applications and considerable effort is therefore expended in either providing compensation in the circuit employing the diode or in improving the semiconductor in order to minimize the transient response effects.

Broadly speaking, therefore, because of transient response, the diode is reluctant to take on its new role of non-conduction when its condition is quickly changed from a forward current to a back voltage.

Figure 3:
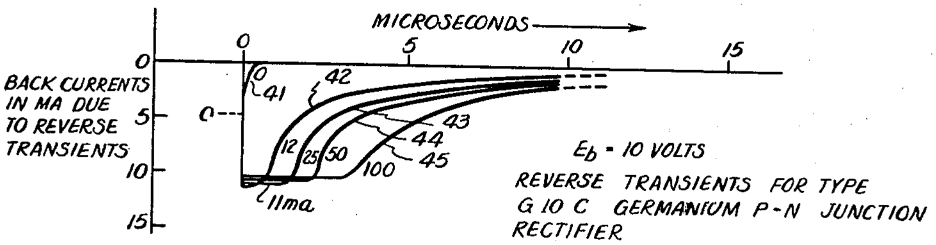
FIGS. 3 and 4 are typical characteristic curves illustrating the effects produced by reverse transients for a type G–10C type of germanium P-N junction rectifier.
Figure 4:
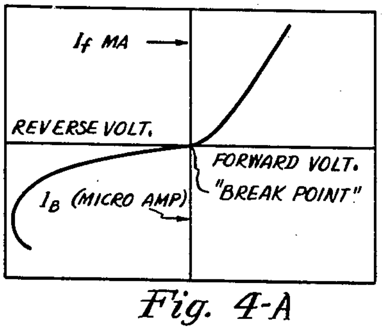

The effect of such transient response on a diode can be experimentally demonstrated. FIGS. 3 and 4 are characteristic curves taken from a paper entitled, "Transient Response Limitations of Various Semiconductor Diodes" by J. H. Wright as published in 1953, "Transistor Short Course Proceedings," Pennsylvania State College, June 8–19, 1953, and show the measured reversed current $I_b$ obtainable for a fixed back voltage condition ($E_b$) immediately following a transition from a previous steady condition of applied forward current $I_f$ (which condition may include a zero current).

FIGS. 3 and 4 show the measured reverse transient results obtained from the test of a G–10C type germanium P-N junction diode. The testing procedure employed involves the measurement of the back current ($I_b$) following transition from a fixed value of applied forward current ($I_f$) to a fixed value of back voltage ($E_b$). The 4 curves shown in FIG. 3 show the value in milliamperes of the measured back current $I_b$ plotted against time in microseconds for 4 separate applied forward current ($I_f$) conditions and for a common back voltage ($E_b$) of 24 volts.

Curve 31 shows the transient effects when the forward current is zero, curve 32 is for an $I_f$ of 12 ma. curve 33 for an $I_f$ of 25 ma. and curve 34 for an $I_f$ of 50 ma. It will be noted from the relationships demonstrated in FIG. 3 that the areas under each of the curves is a measure of available energy and that the included area is greater for larger magnitudes of the applied forward current $I_f$. It will also be noted that the transient period of approximately 5 $\mu$'s common to all of the curves defines a region after which the curves become symmetrically asymptotic.

For purposes of contrast, the result of the same test setup but employing a lower back voltage ($E_b$) of 10 volts is summarized in FIG. 4. The curves 41–45 correspond to the same $I_f$ values as the curves discussed in connection with FIG. 3 and show the values of back current ($I_b$) obtained for an $E_b$ value of 10 volts. For either of the conditions shown in FIG. 3 or 4 the effective reverse impedance of the diode is quite negligible for an appreciable length of time. For example, in the case of a 50 ma. forward current, 1 microsecond elapses before the diode exhibits appreciable back impedance. The curves clearly demonstrate the availability of a considerable amount of energy during the brief but finite interval comprising the reverse transient and the ability of a diode to exhibit low reverse impedance characteristics during the transient response period as compared to its static reverse impedance.

FIG. 4*a* is a typical diode static characteristic curve and shows the relation between an applied forward voltage to the forward current $I_f$ in milliamperes and the variation of back current ($I_b$) in microamperes to an applied reverse voltage. The origin point defining the forward and back resistance of the diode is identified in FIG. 4*a* as the "break point" and corresponds to the point in the diode characteristic where the reverse transient response phenomenon is manifested.

The present invention is singularly adapted to employ such energy as is made available during the reverse transient response period of a diode for the purpose of obtaining signal amplification.

To further illustrate the magnitude of the transient effect, the following table summarizes the results obtained by measuring the peak amplitude of the back current ($I_b$) obtained (in ma.) and the recovery time in microseconds for various magnitudes of applied back voltages $E_b$ for both a Western Electric WE–1786 and a General Electric 9JA1A1 diode. These results were obtained by using a constant forward current $I_f$ of 6 ma. in a test circuit conforming to FIG. 6.

| Back Voltage Applied | Peak Amplitude of Back Current $I_b$ in ma. | | Recovery Time in $\mu$s. | |
|---|---|---|---|---|
| | WE–1786 | GE–4JA1A1 | WE–1786 | GE–4JA1A1 |
| 5 | 0 | 0 | 0 | 0 |
| 6 | 0 | 0 | 0 | 0 |
| 9 | 0 | 3 | 0 | 6 |
| 13 | 10 | 13 | 10 | 4 |
| 20 | 16 | 16 | 10 | 3 |
| 28 | 26 | 32 | 10 | 2 |
| 50 | 45 | 51 | 8 | 1 |
| 70 | 73 | 82 | 6 | 0.75 |

The above chart shows the marked ability of transient effects to establish back currents of comparatively large magnitudes for appreciable time intervals after a back voltage has been applied. For example, the application of a 50-volt back voltage will manifest a back current of 45 milliamperes in a WE–1786 type diode within an 8 microsecond time interval.

Such phenomenon occurs at least to some degree in every semiconductor diode. The static conditions and the reverse transient phenomenon characterizing semiconductor diodes will be briefly described in order to further explain the principles underlying the present invention.

A semiconductor diode has two static conditions, one characterized by high conductivity, called the forward conducting state, and the other characterized by low conductivity, called the reverse conducting state (see FIG. 4*a*). The forward state is attained by applying a biasing voltage so that the anode is more positive than the cathode; the reverse state is attained by applying a biasing voltage of the opposite polarity. The action of the forward voltage is to produce or inject "carriers" of current into the diode thus producing high conductivity. These carriers are not present in the reverse static state. If the voltage applied to the diode is switched quickly from forward to reverse voltage (i.e. at the break point in FIG. 4*a*) the following "transient" phenomenon occurs: A large reverse current flows through the diode for an appreciable length of time after the reverse voltage has been established in accordance with the principles explained in connection with FIGS. 3 and 4. This large current decays after a period of time until the static reverse current is reached. Such large transient current occurs because the carriers which were injected into the diode by the forward voltage remain available to be swept out by the application of a reverse voltage signal. The carriers do not remain available indefinitely during the period between cessation of the forward driving voltage and application of reverse voltage; instead, their number decreases as a function of time during such a period, as is apparent from the analysis of the referred-to experimental results.

*Source of the Amplification*

Figure 2:
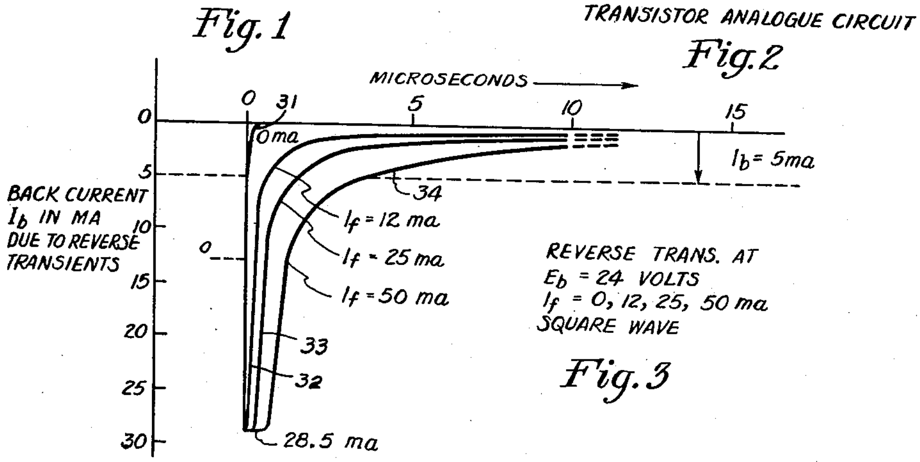
FIG. 2 is a circuit illustrating the analogy of the principles involved in the present invention employing a transistor as an analogue.

The principle by which amplification is obtained according to the present invention is closely related to the manner in which amplification is obtained in transistors. In a transistor, the emitter can be regarded as a diode existing in the forward conduction state, and the collector can be regarded as a diode existing in the reverse conducting state. FIG. 2 shows a transistor circuit analogue which is useful in explaining the principles of the present invention. In FIG. 2, the transistor 20 includes an emitter 21 and collector 22. Means for indicating the emitter voltage and current $E_e$, $I_e$ and the collector voltage and current $E_c$, $I_c$ are also symbolized. The carriers are symbolically shown in solid outline as they exist in connection with the emitter 21 and in dotted outline adjacent the collector 22. If any of the carriers created by the forward biased diode (the emitter) are transported to the vicinity of the reversely biased diode (the collector) a larger current than the static current will flow in the latter (collector) diode because the reverse conductivity thus produced is greater than the reverse static conductivity of the collector diode.

Assume that a certain voltage $E_e$ on the emitter 21 results in a current $I_e$ which produces X carriers. Let these carriers produce a change of current $I_c$ in the collector, in turn producing a change of voltage across the collector $E_c$. The power gain can be expressed in this simple case by the relation $$\frac{I_cE_c}{I_eE_e}=\frac{I_c^2R_c}{I_e^2R_e} \quad (1)$$

where $R_c$=the collector resistance
$R_e$=the emitter resistance.

In the case of a junction transistor used in a common base circuit, $I_c$ is almost equal to $I_e$, so that the power gain is effectively determined by the ratio of the resistances $R_c/R_e$. In other words, the power gain is obtained by a transfer of current from one circuit (the emitter) with low impedance to another circuit (the collector) having high impedance.

The power gain resulting from the diode amplifier comprising the present invention is obtained in an analogous manner, except that in accordance with this invention, one wire is employed as both emitter and collector.

FIG. 1 is a diagrammatic illustration similar to the transistor analogue shown in FIG. 2 but employs a semiconductor diode 10 as the dynamic element. For purposes of illustration, the cathode 15 is shown connected to a switch 12 which may be selectively engaged with either the forward current applying circuit through contact 13 or to the reverse (back) circuit through contact 14. The symbolically illustrated switch operates at a radio frequency rate. In actual practice the switch 12 may therefore comprise a clock pulse of alternating polarity. The first half of the cycle determined by such clock pulse can be simulated by considering the switch 12 connected to contact 13 so that the anode 11 is positive with respect to cathode 15 and the anode will behave in a manner similar to the emitter 21 of the junction transistor analogue 20 shown in FIG. 2. Similarly the remainder of the cycle can be simulated by considering the switch arm 12 in contact with 14 so that the anode 11 is negative with respect to the cathode, analogous to the collector 22 of the transistor 20 (FIG. 2).

Thus, during one portion of an applied clock pulse, anode 11 can be considered as an emitter with switch arm 12 positioned to engage contact 13. The anode 11 is then able to inject carriers into the germanium by the application of a relatively small forward voltage $E_f$ obtained from source 16 because the forward impedance of a semiconductor is characteristically low. During the remaining portion of the clock pulse, anode 11 will be analogous to the collector shown in FIG. 2 and can withdraw the same carriers upon the application of a higher back voltage because of the higher back impedance level characterizing a diode. It must be emphasized that such characteristic "carrier transfer" occurs only during the transient period discussed in connection with FIGS. 3*a*, 3*b*. It is apparent, therefore, that such rudimentary analogue when interpreted in connection with Equation 1 does indicate the existence of an amplification phenomenon.

The analogy with a transistor is of limited usefulness, however, because the amplification is obviously not a continuous phenomenon. The operation of transistors can be explained in terms of current transfer, but such phenomenon is not too meaningful in connection with a diode. It is probably more useful to consider analogies such as carrier transfer or charge transfer. The concept of charge transfer leads to the consideration of a completely different type of analogue model, that comprising variable capacitance.

FIGS. 5*a*–5*f* diagrammatically illustrate an analogue explaining the principles of amplification of the present invention in terms of charge transfer. FIG. 5*a* illustrates the disposition of carriers in a junction diode during the application of forward current and may also illustrate the conditions immediately following the reversal of applied polarity. During forward conduction, minority carriers cross the barrier junction so that the P side, which has holes for its majority carriers, also has electrons. The N side, which has electrons for its majority carriers, also has holes. The major component of electrical impedance is resistive, which is represented as $R_f$ in FIG. 5*d*. At the instant of polarity reversal, the carrier distribution is essentially unaltered, and for a finite length of time the back resistance is equal to the forward resistance $R_f$. During such period those carriers which exist on the "unnatural" side of the boundary, i.e., the minority carriers, will diffuse back to the other side of the boundary. In other words, holes diffuse to the P side, and electrons diffuse to the N side.

FIGS. 5*b* to 5*f* illustrate the phases which display capacitive characteristics. The diode may be likened to a variable capacitor, starting out as a large capacitance (FIG. 5*e*) and ending up as a small capacitance (FIG. 5*f*). The change in the capacitance may be thought of as being due to the decreasing conductivity of the germanium in the region of the junction; in other words, the continued flow of back current $I_b$ depletes the carriers in the germanium near the junction, and thus in effect widens the junction and decreases the effective capacitance as shown in FIG. 5*g*. This process presumably can continue until the junction is widened to its maximum width, at which time the diode finally assumes its static back capacitance and its static back resistance.

It is apparent from the analogue described in connection with FIG. 5 that during the transient response period, the diode exhibits a large capacitance for a finite length of time after forward current has been passed through it and will exhibit a small capacitance for an applied voltage which makes the anode more negative than the cathode. Since the forward impedance of a semiconductor is low, the amount of energy required to "produce" the large capacitance during the forward pulse is considerably smaller than the amount of energy which can be passed through the subsequently created large capacitance, and amplification is consequently attained.

The described phenomena can be utilized in a practicable manner and enables the obtainment of an entirely novel method of amplification which may be embodied in a wide variety of applications, a number of which will be demonstrated.

*Resistance Diode Coupled Amplifier Circuit*

One form of the amplifier circuit comprising the present invention is shown in FIG. 7*a*. FIGS. 7*b*–7*d* illustrate the waveforms involved at like labeled points in FIG. 7*a*. In FIG. 7*a* the cathode 73 of diode 70 is coupled to a clock pulse generator 72 which applies pulses to terminal A as shown in FIG. 7*b*, and the anode 71 is connected to ground and to the clock pulse generator through load resistor 74. In FIG. 7*a* and all subsequent drawings, terminal A represents the point of application of the power source to the cathode electrode of the diode. The power source preferably comprises a clock pulse generator capable of supplying a sine or square wave output pulse and the energy supplied therefrom can be considered as the "dynamic B plus" or as a "radio frequency source." A 1-megacycle pulse generator such as Tektronix Model 105, for example, is satisfactory for such purposes.

As will be apparent from the description of the analogue shown in FIG. 1, the clock pulse source in addition to supplying the power requirements for the amplifier, also serves as an electronic switching means embodying the purpose of the switch 12 and controls the two separate phases of the amplification cycle: The intake of signal power into the amplifier diode (carrier injection) and the output of amplified power (carrier decay). Terminal B in FIG. 7*a* indicates the point of signal application.

The applied clock pulse is shown in FIG. 7*b* while the signal to be amplified which is applied to point B in FIG. 7*a* is illustrated in FIG. 7*c*. FIG. 7*d* shows the output obtained at point C in FIG. 7*a*. The application of the first 3 clock pulses (FIG. 7*b*) to the cathode of diode 70 produces no output pulse as shown in FIG. 7*d* because the diode characteristically acts like a high impedance. The small "spikes" apparent in FIG. 7*d* are due to static capacitance effects and can be virtually eliminated by paralleling resistor 74 with a capacitor, if desired. At a period in the waveform diagram corresponding approximately to $t=3$ µs., the anode 71 of diode 70 will be high with respect to the cathode 73 and a carrier situation will exist analogous to the condition in FIG. 1 with switch 12 connected to contact 13. At such time, therefore, carriers will be injected into the diode in accordance with the theory explained in connection with FIG. 1, and simultaneously if the signal to be amplified (represented as a 2-volt signal in FIG. 7*c*) is applied to input terminal B in FIG. 7*a*, the condition manifested by the diagram of FIG. 7*d* will evolve. Since, due to the discussed transient response of the diode, the reverse transient conductivity is greater than the normal reverse static conductivity of the diode, during the short transient response period described, the diode will present a low impedance to the back voltage presented by the clock pulse when such pulse returns to its plus 20-volt level. In other words, at the portion of the cycle represented by $t=3.5$ µs., the anode 71 will be low with respect to the cathode, but since such polarity reversal occurs during the referred to critical transient period defined by the time in which the injected carriers have not decayed, the reverse impedance of the diode is quite low and remains so for a discernible period.

Such impedance is low compared to the value of the load resistor 74 employed and the clock voltage will therefore produce a significantly large back current $I_b$ as explained in connection with FIG. 3 during such transient period and will result in an output voltage which will appear across the load 74.

By employing the 20-volt clock pulse shown in FIG. 7*b*, power gains of about 10 [average output power/average input power] have been measured. Moreover, the magnitude of the clock pulse employed is limited only to the extent that it must be less than the Zener voltage of the diode employed.

The output pulse is represented at the 3.5 µs. time position in FIG. 7*d*. Its duration is a function of the amplitude of the applied back voltage and the current in accordance with the diode reverse transient characteristics shown in FIG. 7*d* at the $t=4.5$ µs. period is slightly larger than the static capacitance pulses because, at such instant, the carriers have not as yet decayed to a static back condition.

The operation of the basic amplifier illustrated in FIG. 7*a* may be summarized as being consequent to the injection of carriers into the diode by the application to the anode of a forward going signal at a time when the anode is positive with respect to the cathode, followed by the "sweeping out" of such injected carriers within a particular period of time (defined by the transient response period characteristic of the diode employed) by the application at that time of a signal which renders the diode-anode negative with respect to its cathode.

*Transformer Coupled Amplifier (FIG. 8a)*

A variation of the basic amplifier discussed in connection with FIG. 7*a* is illustrated in FIG. 8*a*. The construction is similar except that the primary of a step-down output transformer T84 is employed as the load, and the amplified output is obtained from the transformer secondary. The theory of operation is identical to that explained in connection with the basic amplifier circuit (FIG. 7*a*) as is evident by the characteristic waveforms illustrated in FIGS. 8*b*, 8*d*. The circuit shown in FIG. 8*a* is suitable for the amplification of pulses which have a low duty cycle but will not operate satisfactorily for high duty cycle requirements because the transient period is much less than the flyback or recovery time of the transformer primary. In other words the output obtained from the amplifier construction according to FIG. 8*a* would tend to attenuate as indicated by the waveforms in FIG. 8*d*.

*Transformer Coupled Amplifier with Series Primary Capacitor (FIG. 9a)*

Such deficiency may be partially overcome by employing the modification illustrated in FIG. 9*a*. In this modification, the primary of the output transformer T94 is returned to ground through a resistor 95 and capacitor 96. By such expedient, the potential at terminal D of the transformer can alternate so that the average voltage across the primary is equal to zero. In other words, due to the presence of the capacitor and resistor, point D in FIG. 9*a* starts going positive when a pulse train starts through. Such circuit is therefore not limited by the flyback or recovery time characterizing the output transformer employed. The principle of operation of the modification shown in FIG. 9*a* is otherwise essentially the same as the amplifier shown in FIG. 8*a*. The waveforms shown in FIGS. 9*b*–9*c* correspond to the voltage conditions existing at the like labeled points in FIG. 9*a*. It will be noted that the flyback effects characterizing FIG. 8*d* are absent from the waveform shown in FIG. 9*d*.

*Transformer Diode Coupled Amplifier (FIG. 10a)*

An amplifier circuit highly suitable for computer applications is shown in FIG. 10*a*. A diode 101 in series with a resistor 106 is connected across the primary of transformer T104 and a clock pulse source 105 is connected through diode 102 to terminal D. The phase of the clock pulses obtained from source 105 is inverted with respect to source 103 as is apparent by comparing FIG. 10*f* with FIG. 10*b*. Since the phase of the clock pulse obtained from source 105 is 180 degrees out of phase with power source 103, the flyback period of the transformer primary is limited by the control effects of the former pulses. That is, when a pulse from source 103 is positive, terminal E will be at (an assumed) ground potential by virtue of the state of the pulse shown in FIG. 10*f* at such time period (i.e. $t=2.5$ µs.). Current flow will therefore occur through path A–C–D–E. Immediately following such "power stroke," the clock pulse from source 105 (FIG. 10*f*) will drive terminal E positive ($t=3$ µs.) which will cut off diode 102 and terminal D will therefore assume a polarity determined by the remainder of the circuit. The consequent output signal obtained at terminal F as shown in FIG. 10*g* is not attenuated in the manner obtained by the circuit of FIG. 9*a*. The series diode 101 and resistor 106 between points C—D provides critical damping of the transformer flyback. The principles of amplification governing the embodiment of FIG. 10*a* are otherwise the same as those characterizing the back modification shown in FIG. 7*a*.

*Two-Input Diode Amplifier Gate (FIG. 11a)*

The basic amplifier circuit described may also be adapted for use as a gating device. For such purpose, a 100-ohm resistor 111 and a diode amplifier 110 are connected in series as shown in FIG. 11*a*. Separate signal input sources are provided by terminals B and C and the output is obtained at terminal E. As in the described basic amplifier circuit, the potential of a diode-anode is determined by the instantaneous value of the pulse applied at point A. If, during a zero or ground level of the pulse shown in FIG. 11*b* ($t=3$ µs.) a signal is applied to terminal C, carriers will be injected into the diode 110 and current will flow through the diode 110 and resistor 111. But if a signal is concurrently applied to terminal B there will no longer exist any potential difference across the diode 110 and the signal applied to terminal C will therefore not be effective to inject carriers, and no output is obtainable from terminal E. Similarly if a positive signal is applied to terminal B alone ($t=2$ µs.) during the referred-to transient response period there will be no output obtainable from terminal E because of diode 110. In other words the circuit arrangement shown in FIG. 11*a* provides for the following conditions of operation:

(1) The application of a positive signal to terminal C produces an output obtainable from terminal E.

(2) The concurrent application of positive signals to both input terminals B and C will not produce an output at terminal E.

(3) The application of a positive signal to terminal B alone will not produce an output signal at terminal E.

The chart shown in FIG. 11*g* summarizes such operational effects. In this chart, the edge terms "up" and "down" signify the presence and absence of a positive pulse at the respective terminals C and B. The presence or absence of an output pulse at terminal E is indicated by either the word "up" or "down" at the intersection of such coordinate indicia. For example, when C is "up" and B "down" an output ("up") is obtained at E.

The above action is also apparent from the waveforms shown in FIGS. 11*b*–11*f* which demonstrate the voltage conditions corresponding to be similarly designated points A–E as labeled in FIG. 11*a*. As shown, only when a positive pulse is applied to terminal C alone, will an output be obtained at point E.

The gating action may be summarized to the effect that a signal applied to terminal C will always obtain an output from terminal E unless inhibited by the application of a positive pulse to terminal B. In accordance with conventional terminology, terminal B may be regarded as the inhibitor electrode. It must be emphasized that the described gating circuit operates with a positive inhibiting pulse whereas in known gate construction it is necessary to employ a negative inhibiting pulse. In practice it is necessary that the inhibiting pulse be somewhat greater in amplitude than the pulse applied to terminal C, because of the diode drops. Other or-type diode inputs to terminals B and C are permissible as is apparent. It will be apparent also, by reference to FIG. 11*a* that the described gating action is predicated upon the singular effects obtained by setting up transient response effects by means of a clock pulse and applying the gating signals to terminals B and C within the transient response period according to the theory of operation already described.

It is also possible to construct a three-input and-gate by using a resistor and two diode amplifiers in series. This principle can be extended to an indefinite number of inputs if so desired.

*Pulse Gating and Repeater Stage (FIG. 12)*

An embodiment of the invention as a combined signal gating and repeater stage such as is employed in computer applications is shown in FIG. 12. Such modification employs the combination of the transformer-diode-coupled amplifier described in connection with FIG. 10*a* together with the two input diode gate circuit shown in FIG. 11*a*. Additional or-inputs may be added if desired. In the construction of FIG. 12, two clock pulse sources 121 and 122 are employed in the same manner as described in connection with FIG. 10*a*. As explained in FIG. 11, the application of a positive pulse to terminal C alone will produce an output from the secondary of transformer T124 and an output signal of desired polarity may be obtained by selecting either of the output terminals $F_1$ or $F_2$. It is to be noted that all the basic requirements for a computer repeater stage are satisfied. Delay lines are not needed since the carriers in the diodes can function to store information during the transient response period. Delay lines may, however, be employed if desired.

*Pulse Repeater Stages Employed as a Dynamic Flip Flop (FIG. 13)*

The pulse repeater stage described in connection with FIG. 12 may be combined to function as a dynamic flip flop as shown in FIG. 13. A pair of the repeater stages 131, 132, each of the type shown in FIG. 12 are coupled by the leads 133, 134, as shown. A first source of clock pulses ($CP_1$) 135 of like phase is connected to terminal A of repeater stage 131 and to terminal E of repeater stage 132 while a second clock pulse source ($CP_2$), the pulses of which are 180 degrees out of phase with respect to source $CP_1$ is connected to terminal E of repeater stage 131 and to terminal A of repeater stage 132. The flip flop may be turned on and off from either stage by energizing the appropriate terminals indicated in FIG. 13. Terminal B in either stage is the stop terminal while terminal A is employed to initiate triggering action. Since, as has already been described, the application of a positive pulse to terminal C of stage 131 will initiate conduction thereof, an output pulse will be applied through conductor 133 to a diode 137 paralleling the terminal C input diode in stage 132. Such pulse will trigger stage 132 producing an output which will be transferred through feedback connection 134 to diode 138 which parallels the input diode for starting terminal C of stage 131. In this manner each stage will produce an output for a 1/2 $\mu$s. period and will then initiate the next stage which will conduct for a like 1/2 $\mu$s. period and reinitiate the preceding stage. Such action will continue until a blocking signal is applied to terminal B of either stage. A dynamic flip flop may be considered to be an oscillator having two conditions or states corresponding to an oscillating and nonoscillating condition respectively as is well known. Of course, by rectifying the output obtained, a conventional flip flop having two discrete states comprising positive and negative voltage levels may be obtained.

*Delay Line Dynamic Flip Flop (FIG. 14)*

A flip flop circuit employing the disclosed principles of transient response effects which makes use of a delay line for storing the energy between "power strokes" is illustrated in FIG. 14*a*. This circuit employs a diode 140, the cathode of which is connected at terminal A to a source of clock pulses in the described manner. Terminal B connected to the anode of a diode 141 comprises the start terminal while terminal C, connected to the cathode of a diode 142 is the stop terminal. A delay line designated as 143 is connected to terminal D and an additional diode 144 is connected as shown to terminal E of the delay line. A source of bias is applied at terminal 146 as shown.

The waveforms at terminals A, D, and E, FIG. 14*a* are represented by like designations in FIGS. 14*b*, 14*c*, and 14*d*, respectively.

To initiate the flip flop, terminal B is raised to a potential of plus 2 volts at a period when the clock pulse is at ground level by the application of a pulse to terminal B, and carriers will be injected into diode 140 in the described manner. This is apparent by comparing the 2 microsecond point of waveforms A and D shown in FIGS. 14*b* and 14*c*: During the ensuing transient response period, the clock pulse applied to terminal A will rise to +20 volts as shown in FIG. 14*b* and, because of the high inverse conductivity of the diode during such transitory period the voltage at point D will increase to +20 as shown in FIG. 14*c*. Such action is in accordance with the amplification phenomenon already described. Terminal D comprises the secondary end of delay line 143 while terminal E corresponds to the receiving end.

As is well known, the characteristics of a delay line are such that if the delay line is terminated in an open end, wave reflection will occur without inversion whereas if the line is terminated in a closed end, the reflected wave will be inverted in phase with respect to the transmitted wave. The receiving end E of the delay line 143 is terminated by a diode 144 as shown in FIG. 14*a*. When the magnitude of the referred-to signal pulse at the receiving end D is +20 volts, it will travel once down delay line 143 and the diode 144 which terminates the delay line will present an open circuit to such positive pulse. The pulse is therefore reflected back through the delay line without inversion and will therefore reappear at terminal D as a positive pulse of magnitude +2 as shown in FIG. 14*c* corresponding to the wave position $t=3$ μs. Since the time of arrival of such reflected positive pulse coincides with the period of the clock pulse cycle (i.e. $t=3$ μs.) in which the anode of diode 140 is high, carrier injection will result. Since the diode 140 now appears as a closed end with respect to terminal D of delay line 143, the pulse will now be inverted in phase and therefore will pass down line 143 a third time as a negative pulse. The delay line 143 is selected to furnish a delay period commensurate with the transient response period of the particular diode 140 employed so that the reflected waves will occur periodically and in phase with the clock pulse as is evident by comparing FIGS. 14*b* and 14*c*. Delay lines of any desired time period are well known and commercially available and need not be further described.

Sufficient information governing their design, construction, and applicability can be found in "Electronics Experimental Techniques" by Elmore and Sands, published by McGraw-Hill on pages 38–45.

Following the referred-to carrier injection, the pulse now of negative polarity is returned down delay line a third time. The negative pulse now "sees" the cathode of diode 144 and is transmitted to terminal 146 through resistor 145. The character of the pulse during each periodic arrival at terminal E is demonstrated in FIG. 14*d*. If the period of the clock pulse employed is 1 μs. for example, the delay period $T_d$ of the delay line chosen would be 0.25 μs. and, by comparing FIGS. 14*c* and 14*d* it will be apparent that at time $T_d$ (where T is the delay period of the delay line in μs.) measured from the initial appearance of a pulse at point D (see FIGS. 14*c*, 14*d*) a positive pulse will appear at point E as shown in FIG. 14*d* and is reflected back to point D where it appears at time $2T_d$ to inject carriers into the diode. The pulse is then inserted, as described, and at time $3T_d$ appears again at point E as a negative pulse. It should be observed that diode 144 absorbs the (negative) pulse which appears at terminal E at time period $3T_d$. If such absorption did not occur, the negative pulse would be reflected back to point D and at time $4T_d$ would block carrier injection.

*L-C Dynamic Flip-Flop Circuit (FIG. 15)*

A flip-flop in which a resonant circuit having a suitable time constant $T_d$ related to the clock's pulse period for determining carrier injection is shown in FIG. 15*a*. The resonant circuit comprises an inductance 151 and capacitor 152 connected in parallel to the anode of diode 150 as illustrated in FIG. 15*a*. A bias voltage of +4 volts is applied to terminal 153 and the clock pulse source 154 is connected to energize terminal A.

The principle of operation of the circuit shown in FIG. 15*a* is much the same as the delay time flip flop shown in FIG. 14 since the inductance and capacitance in effect form an elementary delay line. The shape of the waveform at point B as illustrated in FIG. 15*c* indicates that at the end of a power stroke, for example, at a point in the waveform diagram when $t=3$ μs. and $T_d=0$ the voltage at point B flies back to a negative polarity which is approximately twice the magnitude of the positive value of the voltage which existed at point B. At a period $T_d$, where $T_d$ is the time constant of the L-C circuit and may be measured from the beginning of each clock pulse cycle, the pulse will "ring" to a positive value as indicated at a position $t=3.25$ μs., for example, a condition which results in the injection of carriers into diode 150 since at such time period the clock pulse will have rendered the anode of diode 150 high with respect to the cathode. At a period corresponding to 3.5 μs. on the base scale and 2 $T_d$ on the cycle scale, the injected carriers will have resulted in the reverse conductivity of diode 150 being high, since such period lies within the referred-to transient response period characterizing the diode 150. The resulting large back current consequent to the transient response effect is reflected by the large rise in the signal voltage indicated in FIG. 15*c* at a period represented by 3 $T_d$ which corresponds approximately to $t=3.75$ μs. on the base scale.

*Current Doubler Flip Flop (FIG. 16)*

A similar result can be achieved without the use of an L-C circuit. In FIG. 16*a* a capacitive circuit is employed for storing energy between the driving pulses. The energy storing circuit shown in FIG. 16*a* comprises two parallel circuit paths B–D–E and B–C–E. Each path includes diodes 161, 163 and capacitors 165, 166, respectively. Terminal E is connected to ground and terminal B is connected to the anode of diode amplifier 160. A diode 164 joins points D and C of each path.

The manner in which the capacitive circuits function as a current doubler can be explained by ignoring, for the moment, the diode 160 and considering that the voltage of terminal B is alternately greater and lower than the voltage of terminal E.

When terminal B is high with respect to E, diode 161 is cut off and the capacitors 166, 165 will be charged in series by current flow through path B–C–D–E. When terminal B is low with respect to point E, diodes 161 and 163 will conduct while diode 164 will be cut off and the capacitors 165, 166 will discharge in parallel through paths E–D–B and E–C–B respectively. Current doubling is thereby achieved and can be used for the injection of carriers into diode 160 at an appropriate point in the time cycle.

The combination of the referred-to current doubler circuit with diode 160 operating as an amplifier in accordance with the principles previously described, results in a flip-flop circuit which can be explained by reference to the waveforms illustrated in FIGS. 16*b*, 16*e*.

Briefly, if the described capacitive energy storing circuit makes available at terminal B a carrier injecting current at a period of time when the anode of diode 160 is positive or high with respect to the cathode as determined by the clock pulses, then the transient response phenomenon resulting in amplification as has already been explained will occur, and the periodic recurrence of the current doubling phenomenon in synchronism with the clock pulses will enable a continuing output to be obtained.

The waveforms illustrated in FIGS. 16*a*–16*e* show the voltage condition existing at like labeled points in FIG. 16*a* both for the "off" and "on" states of the flip-flop circuit. On the referred-to "power stroke" of the amplification cycle the capacitors 166, 165 will have been charged up in series. Therefore, at a point in the cycle corresponding for example to $t=1$ μs. on the "on state" cycle, the clock pulse will bias diode 160 so that the charged capacitors 166, 165 will discharge in parallel creating a current sufficient to inject carriers into the diode for a 0.5 μs. period following which, the ensuing clock pulse will act to sweep the carriers out during the transient response period, a phenomenon which results in a sufficient back current flow to recharge the capacitors in the described manner. Thus, during 1/2 of the cycle represented by the waveform at A, carrier ejection and energy storage occurs, the store energy thus acting to inject carriers during the remaining portion of the cycle.

In accordance with the described theory the diode functions to produce voltage amplification gain. The energy storing circuit described in FIG. 16*a*, in effect transforms the voltage gain into a current gain necessary for carrier injection.

*Audio Amplifier Using Carrier (FIG. 17)*

The diode amplifier may be employed in the audio frequency range according to the construction shown in FIG. 17*a*. The audio amplifier shown in FIG. 17*a* is similar to FIG. 7*a* and operates on the same principle with the exception that the input signal pulse (FIG. 17*c*) does not necessarily return to zero during the power stroke of the dynamic B plus. In connection with FIG. 17*a*, the clock pulses applied to terminal A may be in the form of a sinusoidal wave similar to an rf carrier and is represented in FIG. 17*b*. The modulating signal applied at terminal B is illustrated in FIG. 17*c*.

Considering one cycle of the modulation signal shown in FIG. 17*c* in relation to the carrier signal of FIG. 17*b* it will be apparent that as the modulating signal became increasingly positive, its action in injecting carriers into the diode 170 and the related nature of the inverse conductivity of the diode during the transitory response period will result in the signal magnitude at point C varying as shown in FIG. 17*d*. Similarly as the modulation signal decreases, there is a declining slope in the envelope of the signal at terminal C with the result that the output signal shown in FIG. 17d is a modulated carrier wave and the envelope of which is an amplified version of the signal applied at input terminal B (FIG. 17*c*).

A modification of FIG. 17*a* is shown in FIG. 18 where the load comprises a low impedance voice coil 181 of a loudspeaker. The operation of this circuit is apparent by referring to the description of the transformer coupled amplifier (FIG. 10*a*) and the described manner of operation of the audio amplifier described in connection with FIG. 17*a*. The impedance of the voice coil 181 is defined by $2\pi L$ where L is the inductance of the coil and $f$ may be one megacycle, for example. Thus the impedance presented to the output of the amplifier is satisfactorily high and obviates the need of an impedance matching output transformer. The RF component is demodulated by the characteristics of the cone.

While a number of specific applications of the basic concept have been particularly shown and described, the disclosed principles for obtaining diode amplifications are inherently capable of adaptation to any problem requiring the singular characteristics of the invention. For example, the device can provide useful amplification at extremely high frequencies since the basic principle, as will be apparent from the description, rests on a kind of law of inertia. The faster the driving waveform (i.e. the clock pulse), the more nearly is the transient impedance equal to the forward impedance.

It is also suggested that while the use of germanium and silicon types of diodes have been emphasized in the description, all semiconductor diodes exhibit the referred-to transient response phenomenon and, furthermore, even a vacuum diode might exhibit such phenomenon as any existing electron cloud can provide a current path in either direction until it is swept out.

As previously noted, considerable research is being devoted to improve the transient responses of commercial semiconductor diodes. The principles underlying the present invention, on the contrary, would be even more efficacious in respect to an unimproved semiconductor diode. In other words, by making the transient response even worse, which can be done with little effort, an improved diode for the purposes of the present invention is readily available in commercial quantities. However, it would be even more desirable to develop a semiconductor diode by increasing its reverse transient while decreasing its forward transient. In addition, it would be desirable to make the time function of decay (see FIGS. 3—4) have a very sharp cutoff. Still another desirable characteristic would be to have a greater transient (conductivity) effect for shorter periods of time in order to obtain better performance at high frequencies.

It is therefore obvious that the invention is not limited to the particular embodiments disclosed but that various modifications and applications may be made without departing from the scope and spirit of the invention.

It will be apparent that the embodiments shown are only exemplary and that various modifications can be made within the scope of invention as defined in the appended claims.

What is claimed is:

1. A signal translating circuit comprising a first semiconductor diode of the type having a reverse transient response period in which the reverse impedance following a forward conducting period remains in a low state for a discernible period, a first pulse source providing periodically recurring first power pulses of one polarity with respect to a point of reference potential, said first power pulses having a duration commensurate with the reverse transient response period characteristic of said diode, means connecting said first pulse source to a first electrode of said first diode, said first diode being poled to be reversely biased by said first power pulses, a second diode, signal input means having one terminal connected to said point of reference potential and a second terminal connected to one electrode of said second diode, the other electrode of said second diode being dissimilar to the second electrode of said first diode and connected thereto, means connecting said second terminal of said first diode to said point of reference potential, said last named means including the series combination of load impedance means, a second pulse source means, and a third diode, said second pulse source means providing second pulses with respect to said point of reference potential of the same polarity as said pulses of said first pulse source, said second pulses occurring in the time intervals between said pulses of said first source and having a duration equal to said time intervals, said third diode being poled to be reversely biased by said second pulse source means.

2. A signal translating circuit comprising a first semiconductor diode of the type having a reverse transient response period in which the reverse impedance following a forward conducting period remains in a low state for a discernible period, a first pulse source providing periodically recurring pulses of one polarity with respect to a point of reference potential, said first pulses having a duration commensurate with the reverse transient response period characteristic of said first diode, means connecting said first source to the first electrode of said first diode, said first diode being poled to be reversely biased by said first pulses, a second diode, signal input means having one terminal connected to said point of reference potential and a second terminal connected to one electrode of said second diode, the other electrode of said second diode being dissimilar to the second electrode of said first diode and connected thereto, a utilization circuit connecting the second electrode of said first diode to said point of reference potential, said utilization circuit comprising a transformer including a primary connected in series with a second pulse source and a third diode, said second power source providing second pulses of the same polarity as said first pulses with respect to said point of reference potential, said second pulses occurring in the time intervals between said first pulses, and said third diode being poled to be reversely biased by said second pulses.

3. A signal translating circuit comprising a first semiconductor diode of the type having a reverse transient period in which the reverse impedance following a forward conducting period remains in a low state for a discernible period, a first pulse source providing periodically recurring pulses of one polarity with respect to a point of reference potential, said first pulses having a duration commensurate with the reverse transient response period characteristic of said first diode, a resistor connected between the output of said first pulse source and the first electrode of said first diode, said first diode being poled to be reversely biased by said first pulses, first input means for applying second pulses to the second electrode of the first diode, second input means for applying gating pulses to said first electrode, said second pulses and gating pulses being of the same polarity as said first pulses with respect to the point of reference potential, said second pulses and gating pulses occurring in the time intervals between said first pulses, and a utilization circuit connecting the second electrode of said first diode to said point of reference potential.

4. The circuit set forth in claim 3 wherein said utilization circuit comprises: a transformer including a primary connected in series with a third pulse source and a second diode, said third pulse source providing third pulses of the same polarity as said first pulses with respect to said point of reference potential, said third pulses occurring in the time intervals between said first pulses, and said second diode being poled to be reversely biased by said third pulses.

5. The circuit set forth in claim 4 comprising: first and second circuit, each defined by the structure set forth in claim 4, means for connecting the secondary of the transformer in said first circuit to the first input means of said second circuit, and means for connecting the secondary of the transformer in said second circuit to the first input means of said first circuit.

References Cited in the file of this patent

UNITED STATES PATENTS

| | | |
|---|---|---|
| 2,581,273 | Miller | Jan. 1, 1952 |
| 2,627,575 | Meachan | Feb. 3, 1953 |
| 2,737,601 | McMahon | Mar. 6, 1956 |
| 2,812,451 | Curtis | Nov. 5, 1957 |
| 2,843,765 | Aigrain | July 15, 1958 |